US009338930B2

(12) United States Patent
Jang et al.

(10) Patent No.: US 9,338,930 B2
(45) Date of Patent: May 10, 2016

(54) SHIELDING REINFORCING APPARATUS

(71) Applicant: Samsung Electronics Co., Ltd., Suwon-si, Gyeonggi-do (KR)

(72) Inventors: Won-Jea Jang, Suwon-si (KR); Dong-In Ha, Yongin-si (KR); Jin-Young Kwak, Seoul (KR); Gi-Heung Kim, Gumi-si (KR); Jung-Yoon Seo, Gumi-si (KR); Jae-Joon Yoo, Seoul (KR); Byoung-Hee Lee, Suwon-si (KR); Sung-Jin Choi, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 15 days.

(21) Appl. No.: 14/260,708

(22) Filed: Apr. 24, 2014

(65) Prior Publication Data

US 2014/0318851 A1     Oct. 30, 2014

(30) Foreign Application Priority Data

Apr. 25, 2013  (KR) .......................... 10-2013-0046138

(51) Int. Cl.
*H05K 9/00*  (2006.01)

(52) U.S. Cl.
CPC ............ *H05K 9/0035* (2013.01); *H05K 9/0028* (2013.01)

(58) Field of Classification Search
CPC .......................... H05K 9/0035; H05K 9/0028
See application file for complete search history.

(56) References Cited

U.S. PATENT DOCUMENTS

| | | | |
|---|---|---|---|
| 5,053,924 A * | 10/1991 | Kurgan | 361/818 |
| 2005/0023018 A1 * | 2/2005 | Horng | 174/350 |
| 2009/0057002 A1 * | 3/2009 | Kakinoki | 174/350 |

FOREIGN PATENT DOCUMENTS

KR    2010-0101493 A    9/2010

* cited by examiner

*Primary Examiner* — Hung V Ngo
(74) *Attorney, Agent, or Firm* — Jefferson IP Law, LLP (57) ABSTRACT

A shield reinforcing apparatus is provided. The shield reinforcing apparatus includes a printed circuit board, a shield member that covers the printed circuit board, and at least one shield reinforcing part provided in the printed circuit board and configured to contact the shield member to be pressed.

17 Claims, 7 Drawing Sheets

SHIELDING REINFORCING APPARATUS

CROSS-REFERENCE TO RELATED APPLICATION(S)

This application claims the benefit under 35 U.S.C. §119(a) of a Korean patent application filed on Apr. 25, 2013 in the Korean Intellectual Property Office and assigned Serial number 10-2013-0046138, the entire disclosure of which is hereby incorporated by reference.

TECHNICAL FIELD

The present disclosure relates to a shield reinforcing apparatus. More particularly, the present disclosure relates to a shield reinforcing apparatus which can prevent a coming-off phenomenon.

BACKGROUND

In general, electronic waves are useful in wireless communications or radars in one aspect but may adversely influence an operation of electronic devices, which is called an Electro-Magnetic Interference (EMI) phenomenon, and the EMI phenomenon generates noise in electronic devices and acts as a harmful element to human bodies.

Thus, in recent years, an EMI phenomenon generated by electronic components installed on a printed circuit board provided within an electronic device is interrupted by covering the electronic components by a member (e.g., a shield part or a shield can), so that the EMI phenomenon cannot influence the corresponding electronic device and other electronic devices. The shield member has a box shape, a lower end of which is opened, to cover an electronic component.

The shield member is fixedly installed on a printed circuit board by a clip, a gasket (adhesive), and a frame is provided to couple and fix a side wall of the shield member while being located on the printed circuit board.

Figure 1:
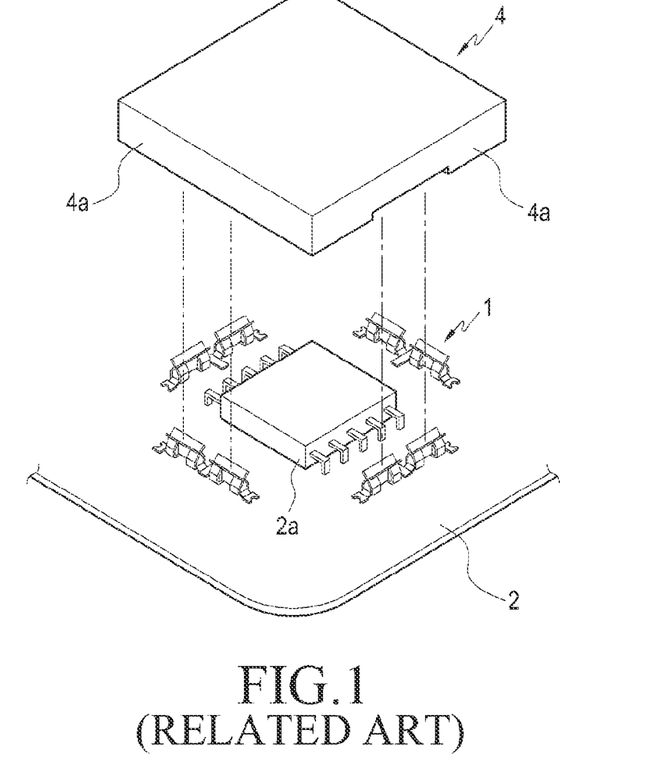
FIG. 1 is an exploded perspective view showing a configuration of a shield member according to the related art.

FIG. 1 is an exploded perspective view showing a configuration of a shield member according to the related art.

Referring to FIG. 1, a shield fixing clip 1 according to the related art includes a printed circuit board 2 provided with an electronic component 2a, a plurality of fixing clips 1 provided on the printed circuit board 2, and a shield member 4 coupled and fixed to the fixing clips 1.

Figure 2:
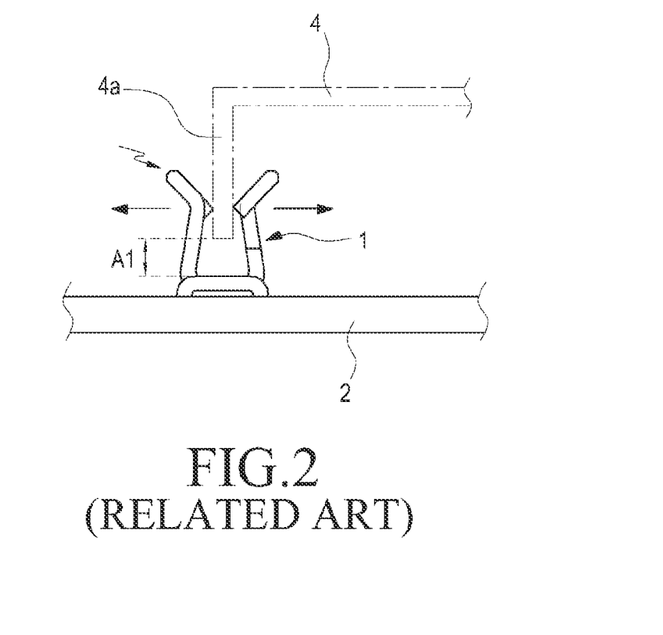
FIG. 2 is a side view showing an operational state of a shield member according to the related art.

FIG. 2 is a side view showing an operational state of the shield member according to the related art.

Referring to FIG. 2, according to the shield fixing clip, when the shield member 4 is coupled to a fixing clip 1, one end of a side wall contact surface 4a of the shield member 4 may come off a bottom surface of the fixing clip 1. For example, the side wall contact surface 4a of the shield member 4 may come off the bottom surface of the fixing clip 1 so as to generate a coming-off space A1. As a result, a shielding power of the shield member 4 is reduced.

The fixing clip may fail to be attached to the side wall contract surface of the shield member, generate a coupling deviation of the shield member due to the coming-off phenomenon, and lower assembly performance of the shield member.

Thus, an apparatus for preventing a coming-off phenomenon generated when a shield member and a fixing clip are coupled to each other, improving shielding power of the shield member, and preventing generation of a coupling deviation of the shield member to improve assembly performance of the product is desired.

A shield can fixing clip for fixing such a shield member is disclosed in Korean Patent No. 10-0886591 (registered on Feb. 25, 2009).

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a shield reinforcing apparatus which includes at least one shield reinforcing part configured to contact a shield member to be pressed in a printed circuit board of an electronic device, so that a coming-off phenomenon generated by an existing shield member (for example, a fixing clip, a gasket, and a frame) can be prevented and shielding power of the shield member can be further improved and reinforced.

Another aspect of the present disclosure is to provide a shield reinforcing apparatus which includes at least one shield reinforcing part such that the shield reinforcing part partially or entirely contacts a contact surface of a shield member in a printed circuit board, so that a coming-off phenomenon generated by an existing shield member can be further prevented, and accordingly, shielding power of the shield member can be further improved and reinforced and an assembly performance of the product can be improved by preventing a deviation in coupling with the shield member.

In accordance with an aspect of the present disclosure, a shield reinforcing apparatus is provided. The shield reinforcing apparatus includes a printed circuit board, a shield member that covers the printed circuit board, and at least one shield reinforcing part provided in the printed circuit board and configured to contact the shield member to be pressed.

In accordance with another aspect of the present disclosure, a shield reinforcing apparatus is provided. The shield reinforcing apparatus includes a printed circuit board, a shield member that covers the printed circuit board, and one or more shield reinforcing parts provided in the printed circuit board, wherein the one or more shield reinforcing parts are in partial contact with contact surfaces of the shield member to be pressed and are in contact with support surfaces of the shield member.

In accordance with another aspect of the present disclosure, a shield reinforcing apparatus is provided. The shield reinforcing apparatus includes a printed circuit board, a shield member that covers the printed circuit board, and one or more shield reinforcing parts provided in the printed circuit board, wherein the one or more shield reinforcing parts are in full contact with contact surfaces of the shield member to be pressed.

In accordance with another aspect of the present disclosure, a shield reinforcing apparatus is provided. The shield reinforcing apparatus includes a printed circuit board, a shield member that covers the printed circuit board, and one or more shield reinforcing parts provided in the printed circuit board, wherein the one or more shield reinforcing parts are in full contact with contact surfaces of the shield member to be pressed and are in contact with support surfaces of the shield member.

According to various embodiments of the present disclosure, a shield reinforcing apparatus which includes at least one shield reinforcing part is configured to contact a shield member to be pressed in a printed circuit board of an electronic device, so that a coming-off phenomenon generated by an existing shield member (e.g., a fixing clip, a gasket, and a frame) can be prevented, shielding power of the shield member can be further improved and reinforced, and shielding power of the product can be further reinforced.

Further, the shield reinforcing apparatus includes at least one shield reinforcing part such that the shield reinforcing part partially or entirely contacts a contact surface of a shield member, prevents a deviation in coupling with the shield member to further improve shielding power and assembly performance of the shield member and improves and reinforces shielding power of the shield member by further preventing a coming-off phenomenon generated by an existing shield member.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

According to various embodiments of the present disclosure, an electronic device may include communication functionality. For example, an electronic device may be a smart phone, a tablet Personal Computer (PC), a mobile phone, a video phone, an e-book reader, a desktop PC, a laptop PC, a netbook PC, a Personal Digital Assistant (PDA), a Portable Multimedia Player (PMP), an mp3 player, a mobile medical device, a camera, a wearable device (e.g., a Head-Mounted Device (HMD), electronic clothes, electronic braces, an electronic necklace, an electronic appcessory, an electronic tattoo, or a smart watch), and/or the like.

According to various embodiments of the present disclosure, an electronic device may be a smart home appliance with communication functionality. A smart home appliance may be, for example, a television, a Digital Video Disk (DVD) player, an audio, a refrigerator, an air conditioner, a vacuum cleaner, an oven, a microwave oven, a washer, a dryer, an air purifier, a set-top box, a TV box (e.g., Samsung HomeSync™, Apple TV™, or Google TV™), a gaming console, an electronic dictionary, an electronic key, a camcorder, an electronic picture frame, and/or the like.

According to various embodiments of the present disclosure, an electronic device may be a medical device (e.g., Magnetic Resonance Angiography (MRA) device, a Magnetic Resonance Imaging (MRI) device, Computed Tomography (CT) device, an imaging device, or an ultrasonic device), a navigation device, a Global Positioning System (GPS) receiver, an Event Data Recorder (EDR), a Flight Data Recorder (FDR), an automotive infotainment device, a naval electronic device (e.g., naval navigation device, gyroscope, or compass), an avionic electronic device, a security device, an industrial or consumer robot, and/or the like.

According to various embodiments of the present disclosure, an electronic device may be furniture, part of a building/structure, an electronic board, electronic signature receiving device, a projector, various measuring devices (e.g., water, electricity, gas or electro-magnetic wave measuring devices), and/or the like that include communication functionality.

According to various embodiments of the present disclosure, an electronic device may be any combination of the foregoing devices. In addition, it will be apparent to one having ordinary skill in the art that an electronic device according to various embodiments of the present disclosure is not limited to the foregoing devices.

Figure 3:
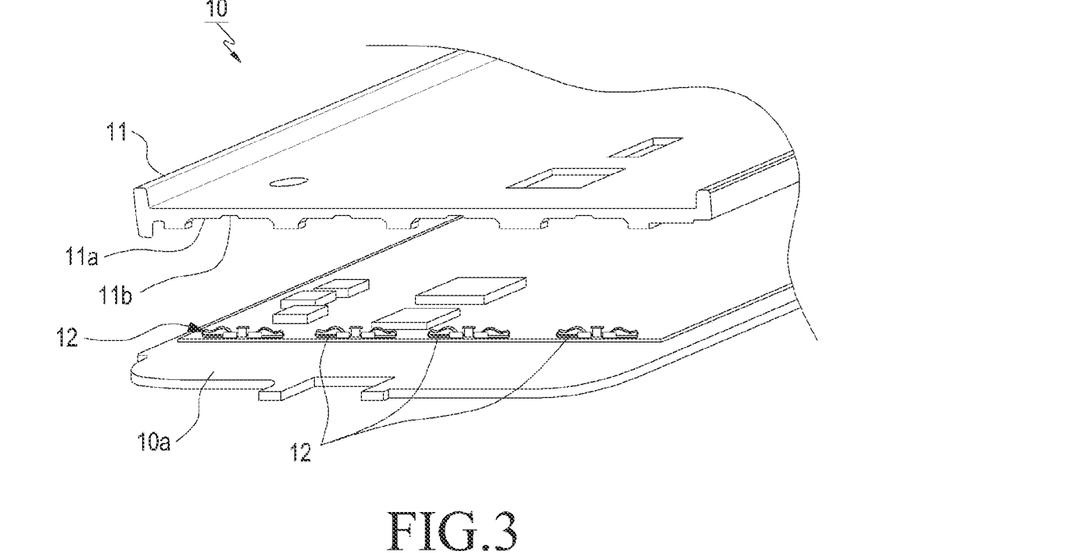
FIG. 3 is an exploded perspective view showing a configuration of a shield reinforcing apparatus according to a first embodiment of the present disclosure.
Figure 4:
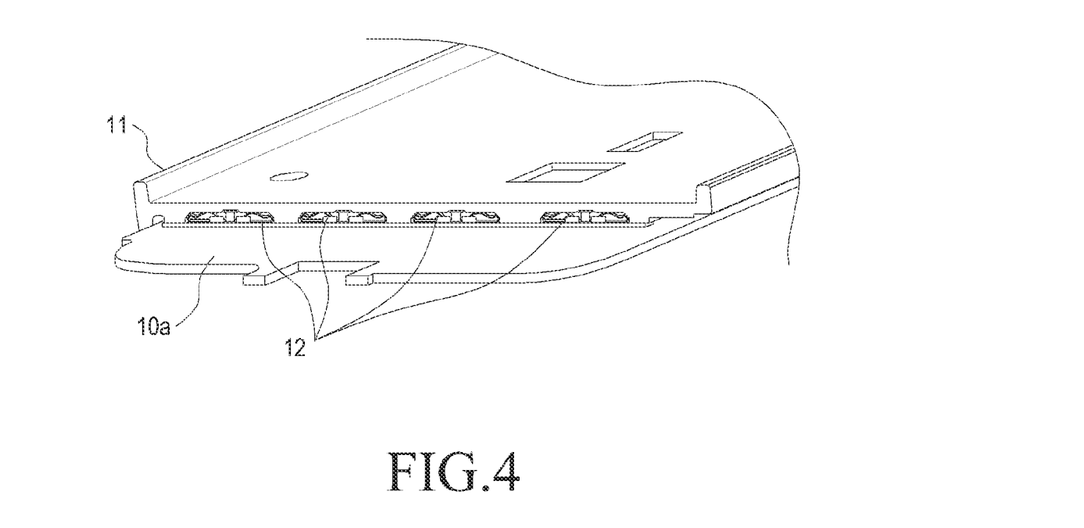
FIG. 4 is a perspective view showing a coupled state of a shield reinforcing apparatus according to the first embodiment of the present disclosure.

FIGS. 3 and 4 are views showing a configuration of a shield reinforcing apparatus according to a first embodiment of the present disclosure. FIG. 3 is an exploded perspective view showing a configuration of a shield reinforcing apparatus according to a first embodiment of the present disclosure. FIG. 4 is a perspective view showing a coupled state of a shield reinforcing apparatus according to the first embodiment of the present disclosure.

Referring to FIGS. 3 and 4, a configuration of the shield reinforcing apparatus according to the first embodiment of the present disclosure will be described. The shield reinforcing apparatus 10 includes a printed circuit board 10a provided in an electronic device (not shown), a shield member 11 covering the printed circuit board 10a, and one or more shield reinforcing parts 12. The shield reinforcing parts 12, which will be described below, may be provided on a surface of the printed circuit board 10a. The shield member 11 may be configured to cover an upper surface of the printed circuit board 10a to interrupt (e.g., inhibit) an Electro-Magnetic Interference (EMI) phenomenon generated by electronic components provided in the printed circuit board 10a. The shield reinforcing members 12 are provided on the surface of the printed circuit board 10a so as to partially contact side contact surfaces 11a provided in the shield member 11 to be pressed and to contact support surfaces 11b of the shield member 11.

According to various embodiments of the present disclosure, the shield member 11 may be a shield can or a bracket.

The shield reinforcing parts 12 may be of a Surface Mounted Device (SMD) type such that the shield reinforcing parts 12 are mounted to a surface of the printed circuit board 10a. For example, the shield reinforcing parts 12 may be mounted to portions of the printed circuit board 10a which need to be shielded in an SMD type.

However, the mounting of the shield reinforcing parts 12 is not limited to the SMD type, and the mounting type may be arbitrarily modified. For example, the mounting type may be variously modified provided that the shield reinforcing parts 12 can be mounted to the surface of the printed circuit board 10a. For example, the shield reinforcing parts may be integrally mounted to the printed circuit board through injection molding.

The shield reinforcing parts 12 is mounted to a surface of the printed circuit board 10a and is configured to partially contact the contact surfaces 11a of a side wall of the shield member 11 to be pressed. According to various embodiments of the present disclosure, the interaction between the shield reinforcing parts 12 and the contact surfaces 11a of the side wall of the shield member 11 (e.g., the contact therebetween) prevents (e.g., inhibits) a coming-off phenomenon generated in an existing shield member and further improves shielding power of the shield member.

In addition, the shield reinforcing parts 12 are provided in coming-off spaces generated when a fixing clip and the shield member 12 according to the related art are coupled to each other, thereby preventing the above-mentioned coming-off phenomenon, and accordingly, preventing a deviation in coupling with the shield member 11 to improve assembly performance of the shield member 11 and the printed circuit board 10a.

According to various embodiments of the present disclosure, the contact surfaces 11a of the shield member 11 may be contact recesses so as to partially contact the shield reinforcing parts 12. According to various embodiments of the present disclosure, the support surfaces 11b of the shield member 11 may be support recesses such that support portions 12b of the shield reinforcing parts 12 are inserted into the support recesses.

Figure 5:
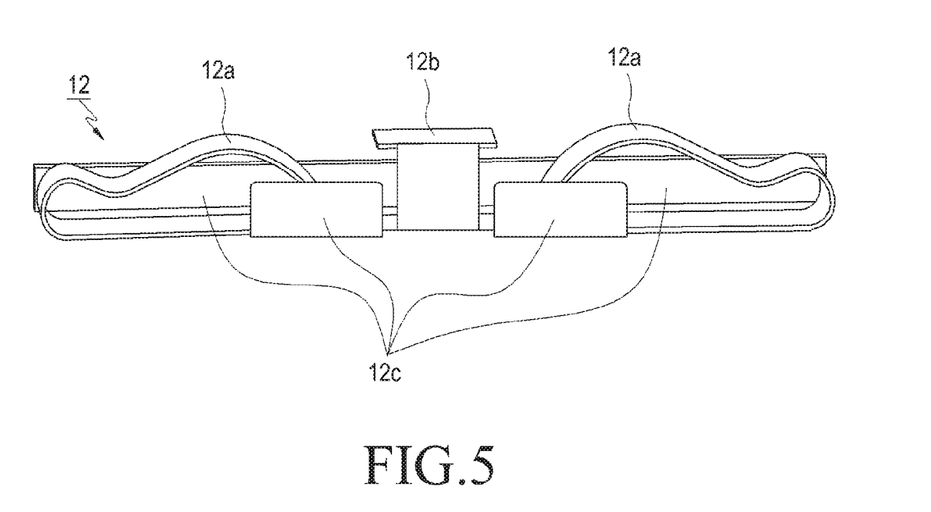
FIG. 5 is an enlarged perspective view showing a coupled state of a shield reinforcing apparatus according to the first embodiment of the present disclosure.

FIG. 5 is an enlarged perspective view showing a coupled state of a shield reinforcing apparatus according to the first embodiment of the present disclosure.

Referring to FIG. 5, each of the shield reinforcing parts 12 according to the embodiment of the present disclosure includes a pair of contact portions 12a, a pair of support portions 12b, and at least one reinforcing member 12c. The contact portions 12a partially contact the contact surfaces 11a of the shield member 11. According to various embodiments of the present disclosure, the support portions 12b may be provided between the contact portions 12a to contact the support surfaces 11b of the shield member 11. The reinforcing members 12c may be provided on opposite sides of the contact portions 12a to support the contact portions 12a and to reinforce shielding power of the shield member 11.

According to various embodiments of the present disclosure, the contact portions 12a may be curved plate springs. The contact portions 12a may be another type of spring such as wire springs, and/or the like in addition to the curved plate springs.

According to various embodiments of the present disclosure, the shield reinforcing parts 12 may be applied to an electronic device or a portable terminal.

As discussed above, the electronic device according to the embodiment of the present disclosure includes all information and communication devices and multimedia devices, such as a PMP, an MP3 player, a navigation unit, a game player, a notebook, a netbook, an advertising panel, a TV, a digital broadcasting receiver, a Personal Digital Assistant, and a smart phone, as well as all kinds of mobile communication terminals which operate according to communication protocols corresponding to various communication systems, and application devices thereof.

In more detail, as illustrated in FIG. 3, in the mounting disposition of the shield reinforcing parts 12 mounted to the printed circuit board 10a, the printed circuit board 10a includes the shield reinforcing parts 12 such that the shield reinforcing parts 12 contact the contact surfaces 11a of the shield member 11 on one side, and includes a plurality of fixing clips (not shown) such that the fixing clips contact the contact surfaces 11a of the shield member 11 on the other side. According to various embodiments of the present disclosure, other fixing units other than the fixing clips (not shown) may be applied. For example, the shield member 11 has a tetragonal shape, in which state the shield reinforcing parts 12 are provided at portions of the printed circuit board 10a corresponding to the contact surfaces 11a of one side wall of the shield member 11 and the fixing clips are provided at portions of the printed circuit board 10a corresponding to the contact surfaces 11a of a side wall of another shield member 11.

According to various other embodiments of the present disclosure, the printed circuit board 10a includes the shield reinforcing parts 12 such that the shield reinforcing parts 12 are in contact with contact surfaces 11a of an entire side wall of the shield member 11. For example, the printed circuit board 10a includes shield reinforcing parts 12 at portions corresponding to the contact surfaces 11a of the entire side wall of the tetragonal shield member 11. In particular, the shield reinforcing parts 12 may be mounted to the printed circuit board 10a in a tetragonal shape to correspond to the tetragonal shield member 11.

Hereinafter, an assembly process of the shield reinforcing parts 12 according to the embodiment of the present disclosure will be described in more detail.

Figure 6:
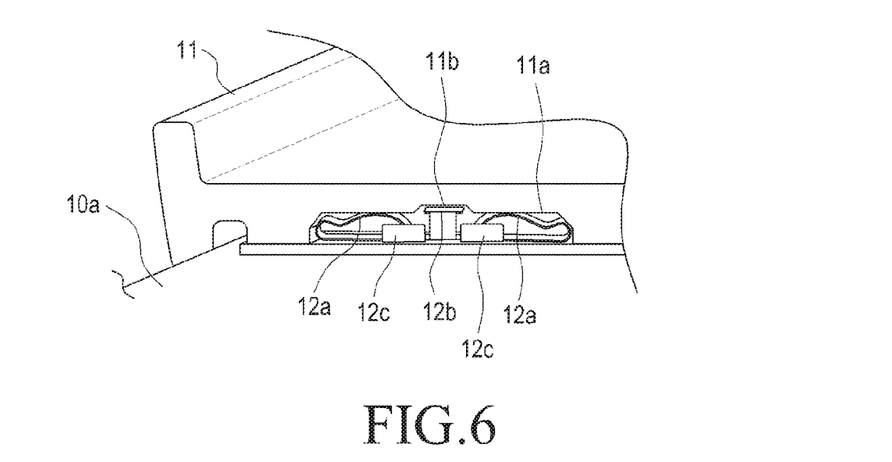
FIG. 6 is a perspective view showing an operational state of a shield reinforcing apparatus according to the first embodiment of the present disclosure.

FIG. 6 is a perspective view showing an operational state of a shield reinforcing apparatus according to the embodiment of the present disclosure.

Referring to FIGS. 5 and 6, the shield reinforcing parts 12 are mounted to portions of the surface of the printed circuit board 10a. For example, the shield reinforcing parts 12 are mounted to portions of the surface of the printed circuit board 10a that need to be shielded in an SMD type. For example, the shield reinforcing parts 12 may be provided at outer circumferences or portions of the electronic components provided in the printed circuit board 10a.

In this state, as illustrated in FIG. 5, the shield member 11 is coupled to upper portions of the shield reinforcing parts 12. The side wall contact surfaces 11a of the shield member 11 partially contact the contact portions 12a of the shield reinforcing parts 12 and the support surfaces 11b of the shield member 11 may be inserted into the support portions 12b of the shield reinforcing parts 12.

As illustrated in FIG. 6, if the shield member 11 is pressed, the contact portions 12a of the shield reinforcing parts 12 are pressed by a resilient force, and the support portions 12b of the shield reinforcing parts 12 contact the support surfaces 11b of the shield member 11 while being inserted into the support surfaces 11b of the shield member 11. For example, the contact portions 12a of the shield reinforcing parts 12 are pressed and partially contact the contact surfaces 11a of the shield member 11 at the same time such that the shield member 11 can shield the printed circuit board 10a.

Figure 15:
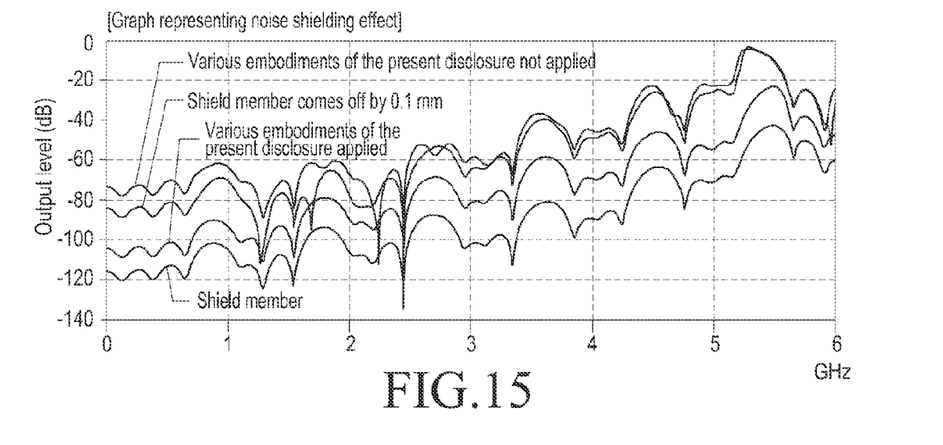
FIG. 15 is a graph showing noise shielding effects of shield reinforcing apparatuses according to the first, second, and third embodiments of the present disclosure.

FIG. 15 is a graph showing noise shielding effects of shield reinforcing apparatuses according to the first, second, and third embodiments of the present disclosure.

Referring to FIG. 15, if a graph showing a case in which the shield reinforcing apparatus 10 according to various embodiments of the present disclosure is applied is compared with a graph showing a case in which the shield member 11 comes off by 0.1 mm, the graph shows that the various embodiments of the present disclosure improve shielding power by a maximum of 20 dB.

Further, even if a case of applying the shield reinforcing parts 12 according to various embodiments of the present disclosure is compared with a case of not applying the shield reinforcing parts 12, the graph shows that the various embodiments of the present disclosure improve shielding power by a maximum of 20 dB.

In particular, as discussed in with reference to the result of a test in which the shield reinforcing apparatus 10 according to various embodiments of the present disclosure is applied, if the shield reinforcing parts 12 according to various embodiments of the present disclosure are applied to the printed circuit board 10a, shielding power can be improved by a maximum of 20 dB as compared with a state in which the shield member 11 comes off by 0.1 mm or in which the various embodiments of the present disclosure are not applied.

Thus, the first embodiment of the present disclosure can prevent (or otherwise reduce) a coming-off phenomenon generated by the existing shield member 11 and can prevent (or otherwise reduce) generation of a deviation in coupling of the shield member 11 as well.

Hereinafter, the configuration of the shield reinforcing apparatus according to a second embodiment of the present disclosure will be described with reference to FIGS. 7 and 8.

Figure 7:
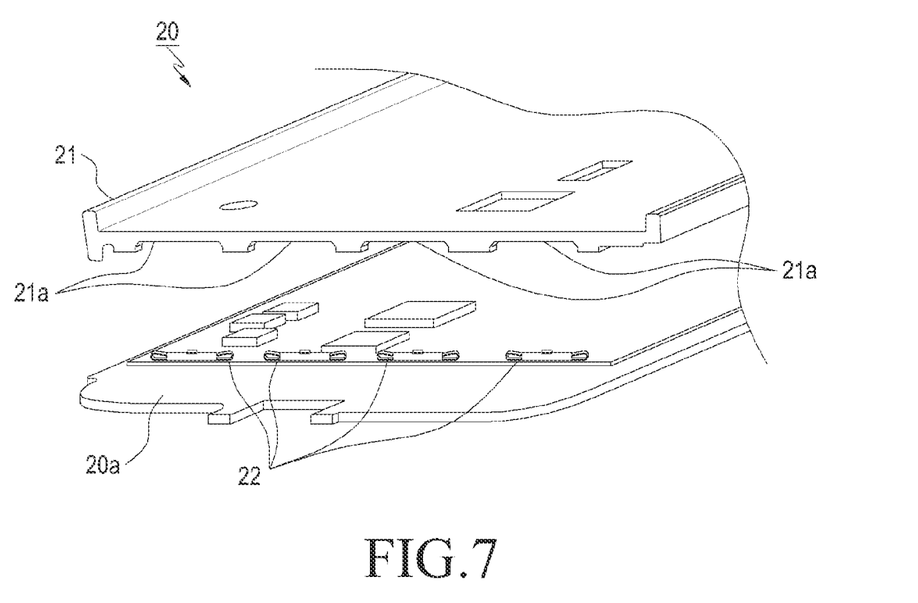
FIG. 7 is an exploded perspective view showing a configuration of a shield reinforcing apparatus according to a second embodiment of the present disclosure.
Figure 8:
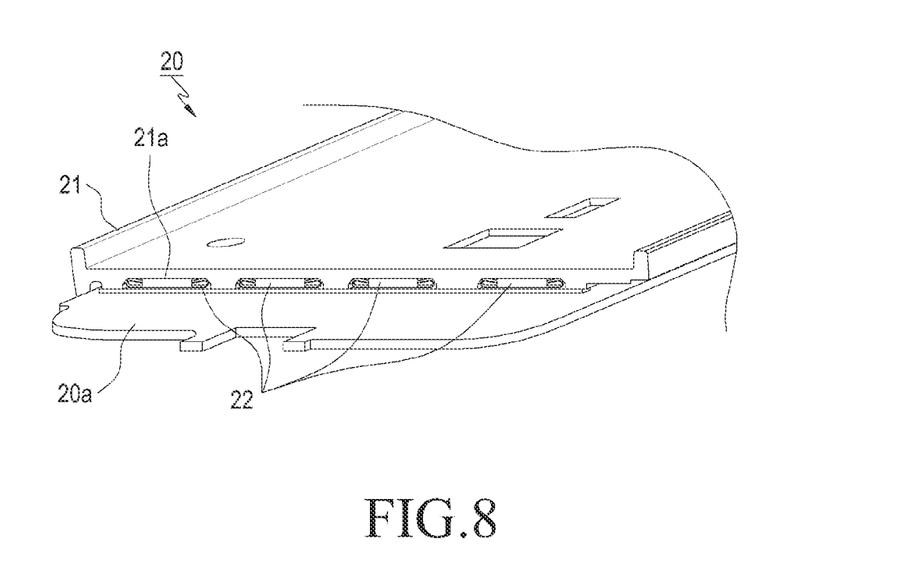
FIG. 8 is a perspective view showing a coupled state of a shield reinforcing apparatus according to the second embodiment of the present disclosure.

FIGS. 7 and 8 are views showing a configuration of a shield reinforcing apparatus according to a second embodiment of the present disclosure. FIG. 7 is an exploded perspective view showing a configuration of a shield reinforcing apparatus according to a second embodiment of the present disclosure. FIG. 8 is a perspective view showing a coupled state of a shield reinforcing apparatus according to the second embodiment of the present disclosure.

Referring to FIGS. 7 and 8, the shield reinforcing apparatus 20 may include a printed circuit board 20a provided in an electronic device (not shown), a shield member 21 covering the printed circuit board 20a, and one or more shield reinforcing parts 22. The shield reinforcing parts 22 may be provided on a surface of the printed circuit board 20a to entirely contact side wall contact surfaces 21a provided in the shield member 21 to be pressed.

A detailed description of the shield member 21 has been described in relation to the first embodiment of the present disclosure, and thus will be omitted.

The shield reinforcing parts 22 of the second embodiment of the present disclosure are mounted to the surface of the printed circuit board 20a in an SMD type and are configured to contact the entire contact surfaces 21a of the side wall of the shield member 21 to be pressed. Accordingly, the shield reinforcing parts 22 may prevent a coming-off phenomenon generated by the existing shield member and may further improve shielding power of the shield member 21.

The shield reinforcing parts 22 may be provided in coming-off spaces generated when a fixing clip and the shield member 21 according to the related art are coupled to each other, thereby preventing the above-mentioned coming-off phenomenon. Accordingly, the shield reinforcing parts 22 may prevent a deviation in coupling with the shield member 21 to improve assembly performance of the shield member 21 and the printed circuit board 20a.

The contact surfaces 21a of the shield member 21 may be contact recesses such that the contact recesses contact the entire shield reinforcing parts 22.

Figure 9:
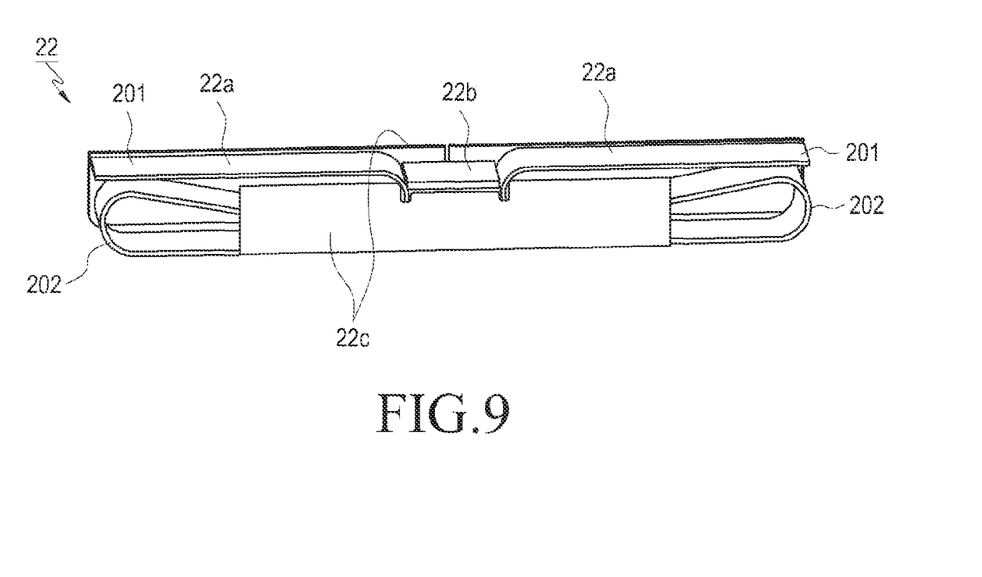
FIG. 9 is an enlarged perspective view showing a coupled state of a shield reinforcing apparatus according to the second embodiment of the present disclosure.

FIG. 9 is an enlarged perspective view showing a coupled state of a shield reinforcing apparatus according to the second embodiment of the present disclosure.

Referring to FIG. 9, each of the shield reinforcing parts 22 includes a pair of contact portions 22a, a support surface 22b, and at least one reinforcing member 22c. The contact portions 22a entirely contact the contact surfaces 21a of the shield member 21. The support surface 22b is provided between the contact portions 22a to contact the contact surfaces 21b of the shield member 21. The reinforcing members 22c may be provided on opposite sides of the contact portions 22a to support the contact portions 22a and to reinforce shielding power of the shield member 21.

According to various embodiments of the present disclosure, upper portions 201 of the contact portions 22a are planar plates such that the plates may entirely contact the contact surfaces of the shield member 21, and lower portions 202 of the contact portions 22a may be curved plates connected to the planar plate such that the curved plates may be pressed by resiliency when the contact surfaces 21a of the shield member 21 and the shield reinforcing parts 22 are entirely coupled to each other. The contact portions 22a may be bent plate springs. The contact portions 22a may be another type of spring such as a wire spring, and/or the like.

Application and mounting examples of the shield reinforcing parts 22 have been described in relation to the first embodiment of the present disclosure, and thus will be omitted. Hereinafter, an assembly process of the shield reinforcing parts 22 will be described in more detail.

Figure 10:
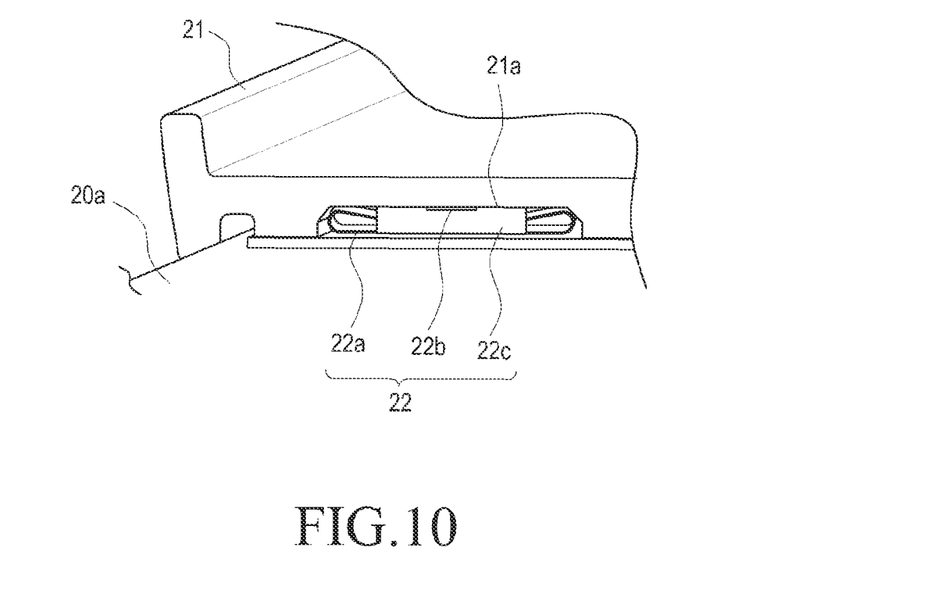
FIG. 10 is a perspective view showing an operational state of a shield reinforcing apparatus according to the second embodiment of the present disclosure.

FIG. 10 is a perspective view showing an operational state of a shield reinforcing apparatus according to the embodiment of the present disclosure.

First, as illustrated in FIGS. 7 and 8, the shield reinforcing parts 22 are mounted to portions of the surface of the printed circuit board 20a which need to be shielded in an SMD type. For example, the shield reinforcing parts 22 may be provided at outer circumferences or portions of the electronic components provided in the printed circuit board 20a.

In this state, as illustrated in FIG. 9, the shield member 21 is coupled to upper portions of the shield reinforcing parts 22. The side wall contact surfaces 21a of the shield member 21 are in full contact with the contact portions 22a of the shield reinforcing parts 22. For example, the side wall contact surfaces 21a of the shield member 21 may entirely contact the contact portions 22a of the shield reinforcing parts 22. The contact surfaces 21a of the shield member 21 may correspond to the support surfaces 22b of the shield reinforcing parts 22.

Referring to FIG. 10, if the shield member 21 is pressed, then the contact portions 22a of the shield reinforcing parts 22 are pressed by a resilient force, and the support surfaces 22b of the shield reinforcing parts 22 may contact the contact surfaces 21b of the shield member 21. For example, the contact portions 22a of the shield reinforcing parts 22 are pressed and the contact portions 22a of the shield reinforcing parts 22 may come in full contact with the contact surfaces 21a of the shield member 21 at the same time such that the shield member 21 can shield the printed circuit board 20a. For example, the contact portions 22a of the shield reinforcing parts 22 may be pressed and entirely contact the contact surfaces 21a of the shield member 21 at the same time.

For example, the contact portions 22a of the shield reinforcing parts 22 are pressed and entirely contact the contact surfaces 21a of the shield member 21 at the same time such that the shield member 21 can be shielded.

The shield reinforcing parts 22 shield the shield member 21, and the characteristics thereof have been described in relation to the first embodiment of the present disclosure and thus will be omitted.

Referring to FIG. 15, when a graph showing a case in which the shield reinforcing apparatus 20 according to various embodiments of the present disclosure is applied is compared with a graph showing a case in which the shield member 21 comes off by 0.1 mm, the graph shows that the various embodiments of the present disclosure improve shielding power by a maximum of 20 dB.

Even if a case of applying the shield reinforcing parts 22 according to various embodiments of the present disclosure is compared with a case of not applying the shield reinforcing parts 22, the graph shows that various embodiments of the present disclosure improve shielding power by a maximum of 20 dB.

In particular, as discussed with reference to the graph showing the result of a test in which the shield reinforcing apparatus 20 according to various embodiments of the present disclosure is applied, when the shield reinforcing parts 22 according to various embodiments of the present disclosure are applied to the printed circuit board 20a, shielding power can be improved by a maximum of 20 dB as compared with a state in which the shield member 21 comes off by 0.1 mm or in which various embodiments of the present disclosure is not applied.

Figure 11:
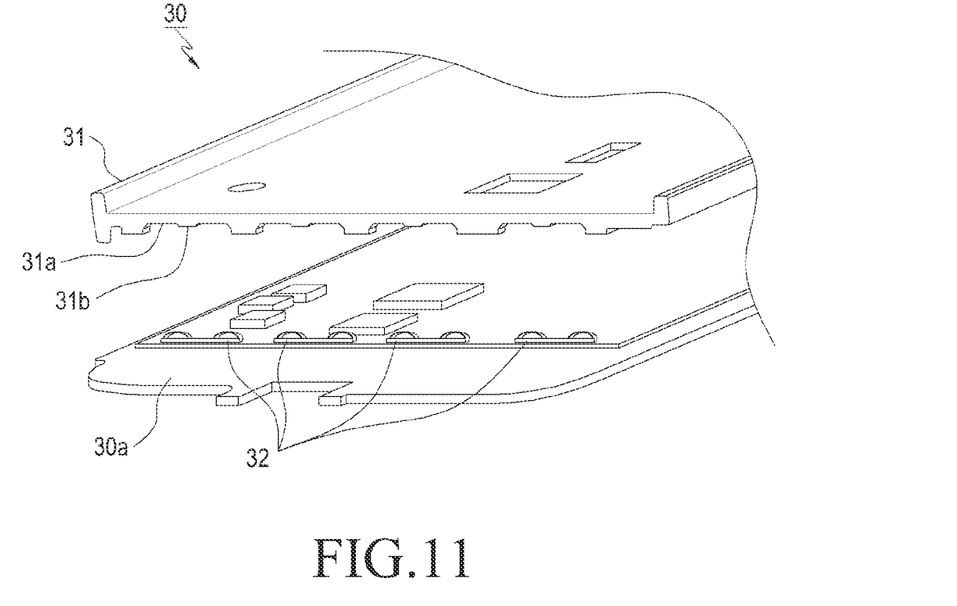
FIG. 11 is an exploded perspective view showing a configuration of a shield reinforcing apparatus according to a third embodiment of the present disclosure.
Figure 12:
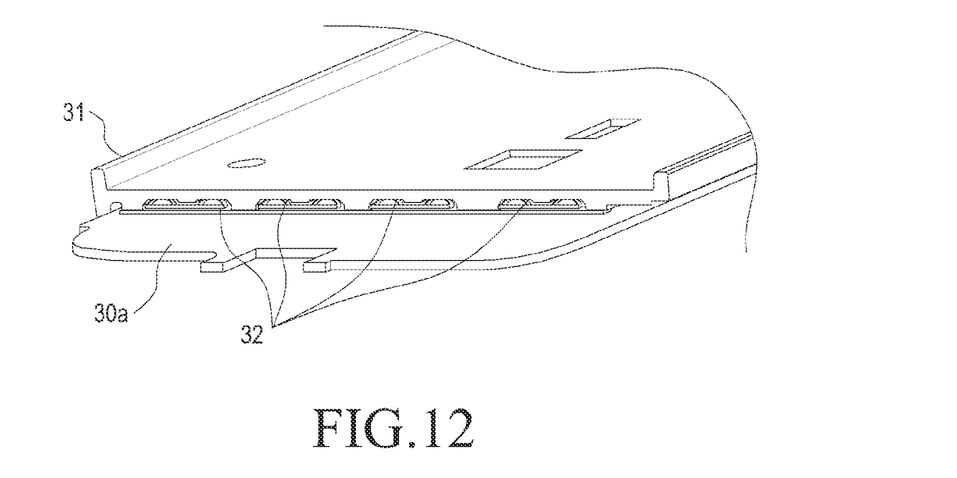
FIG. 12 is a perspective view showing a coupled state of a shield reinforcing apparatus according to the third embodiment of the present disclosure.

FIGS. 11 and 12 are views showing a configuration of a shield reinforcing apparatus according to a third embodiment of the present disclosure. FIG. 11 is an exploded perspective view showing a configuration of a shield reinforcing apparatus according to a third embodiment of the present disclosure. FIG. 12 is a perspective view showing a coupled state of a shield reinforcing apparatus according to the third embodiment of the present disclosure.

Referring to FIGS. 11 and 12, the configuration of the shield reinforcing apparatus according to the third embodiment of the present disclosure will be described. The shield reinforcing apparatus 30 may include a printed circuit board 30a provided in an electronic device (not shown), a shield member 31 covering the printed circuit board 30a, and one or more shield reinforce parts 32. The shield reinforcing parts 32 are provided on the surface of the printed circuit board 30a to entirely contact side contact surfaces 31a provided in the shield member 31 to be pressed and to contact support surfaces 31b of the shield member 31.

A detailed description of the shield member 31 has been described in relation to the first embodiment of the present disclosure, and thus will be omitted.

The shield reinforcing parts 32 may be mounted to the surface of the printed circuit board 30a in an SMD type, and are pressed so as to make full contact with the contact surfaces 31a of a side wall of the shield member 31 and to contact the support surfaces 31b of the shield member 31. For example, the shield reinforcing parts 32 may be pressed to entirely contact the contact surfaces 31a of the side wall of the shield member 31 and contact the support surfaces 31 of the shield member 31. Such contact may prevent a coming-off phenomenon generated by the existing shield member and a deviation in coupling with the shield member 31 to further reinforce shielding power of the shield member. Further, an assembly performance of the shield member 31 and the printed circuit board 30a can be improved.

In more detail, the contact surfaces 31a of the shield member 31 are contact recesses to entirely contact the shield reinforcing parts 32, and the support surfaces 31b of the shield member 31 are contact bosses such that support portions 32b of the shield reinforcing parts 32 contact the contact bosses. Although it is exemplified that the contact surfaces are contact recesses and the support surfaces are contact bosses, various embodiments of the present disclosure are not limited thereto. For example, any configuration which entirely contact the shield reinforcing parts or contact the support portions of the shield reinforcing parts may be applied as various modified embodiments.

Figure 13:
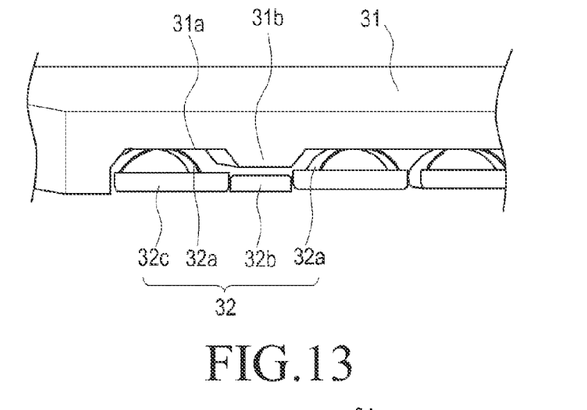
FIG. 13 is an enlarged perspective view showing a coupled state of a shield reinforcing apparatus according to the third embodiment of the present disclosure.

FIG. 13 is an enlarged perspective view showing a coupled state of a shield reinforcing apparatus according to the third embodiment of the present disclosure.

Referring to FIG. 13, each of the shield reinforcing parts 32 includes a pair of contact portions 32a, a support portion 32b, and at least one reinforcing member 32c. The contact portions 32a may be in full contact with the contact surfaces 31a of the shield member 31. For example, the contact portions 32a may entirely contact the contact surfaces 31a of the shield member 31. Of course, the support portions 32b are provided between the contact portions 32a to contact the support surfaces 31b of the shield member 31. The reinforcing members 32c may be provided on opposite sides of the contact portions 32a to support the contact portions 32a and reinforce shielding power of the shield member 31.

The contact portions 32a may be another type of spring such as a wire spring, a curved plate spring, and/or the like.

Application and mounting examples of the shield reinforcing parts 32 also have been described in relation to the first embodiment of the present disclosure, and thus will be omitted.

Hereinafter, an assembly process of the shield reinforcing parts 32 will be described in more detail.

Figure 14:
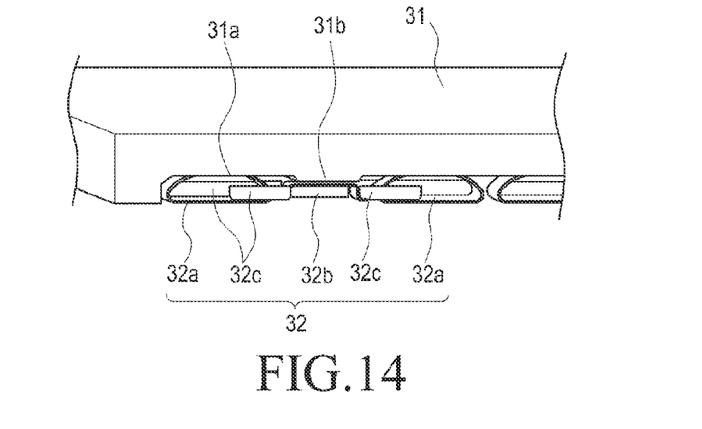
FIG. 14 is a perspective view showing an operational state of a shield reinforcing apparatus according to the third embodiment of the present disclosure.

FIG. 14 is a perspective view showing an operational state of a shield reinforcing apparatus according to the third embodiment of the present disclosure.

First, as in FIGS. 11 and 12, the shield reinforcing parts 32 are mounted to portions of the surface of the printed circuit board 30a which need to be shielded in an SMD type. For example, the shield reinforcing parts 32 may be provided at outer circumferences or portions of the electronic components provided in the printed circuit board 30a.

In this state, referring to FIG. 13, the shield member 31 is coupled to upper portions of the shield reinforcing parts 32. The side wall contact surfaces 31a of the shield member 31 may be in full contact with the contact portions 32a of the shield reinforcing parts 32. For example, the side wall contact surfaces 31a of the shield member 31 entirely contact the contact portions 32a of the shield reinforcing parts 32. The support surfaces 31b of the shield member 31 may correspond to the support portions 32b of the shield reinforcing parts 32.

Referring to FIG. 14, if the shield member 31 is pressed, the contact portions 32a of the shield reinforcing parts 32 are pressed by a resilient force, and the support portions 32b of the shield reinforcing parts 32 may contact the support surfaces 31b of the shield member 31.

For example, the contact portions 32a of the shield reinforcing parts 32 are pressed and may be in full contact with the contact surfaces 31a of the shield member 31 at the same time such that the shield member 31 can shield the printed circuit board 30a. For example, the contact portions 32a of the shield reinforcing parts 32 are pressed and may entirely contact the contact surfaces 31a of the shield member 31.

Because the support surfaces 31b of the shield member 31 have contact bosses, the contact portions 32a of the shield reinforcing parts 32 entirely contact the contact surfaces 31a of the shield member 31 and the contact bosses contact the support portions 32b of the shield reinforcing parts 32.

According to various embodiments of the present disclosure, the shield reinforcing parts 32 are mounted to the printed circuit board 30a to be in full contact with the contact surfaces 31a of the shield member 31 when being coupled to the shield member 31. For example, the shield reinforcing parts 32 are mounted to the printed circuit board 30a to entirely contact the contact surfaces 31a of the shield member 31 when being coupled to the shield member 31. The contact bosses of the shield member 31 contact the support portions 32b of the shield reinforcing parts 32. As a result, the above-described coming-off phenomenon and a deviation in coupling with the shield member 31 may be prevented and shielding power and assembly performance of the product may be further improved.

Referring to FIG. 15, when a graph showing a case in which the shield reinforcing apparatus 30 according to various embodiments of the present disclosure is applied is compared with a graph showing a case in which the shield member 31 comes off by 0.1 mm, the graph shows that various embodiments of the present disclosure improve shielding power by a maximum of 20 dB.

Even if a case of applying the shield reinforcing parts 32 according to various embodiments of the present disclosure is compared with a case of not applying the shield reinforcing parts 32, the graph shows that various embodiments of the present disclosure improve shielding power by a maximum of 20 dB.

In particular, as discussed with reference to the graph showing the result of a test in which the shield reinforcing apparatus 30 according to various embodiments of the present disclosure is applied, when the shield reinforcing parts 32 according to various embodiments of the present disclosure are applied to the printed circuit board 30a, shielding power can be improved by a maximum of 20 dB as compared with a state in which the shield member 31 comes off by 0.1 mm or in which the various embodiments of the present disclosure are not applied.

In this way, because the shield member 4 (see FIG. 1) according to the related art generates the above-mentioned coming-off phenomenon A1 (see FIG. 2) by a predetermined height from the bottom surface of the existing clip, shielding power of the shield member 4 is lowered and a coupling deviation is generated as the fixing clip is not attached.

Thus, the first, second, and third embodiments of the present disclosure include the shield reinforcing parts 12, 22, and 32 to prevent the existing coming-off phenomenon and a coupling deviation and to improve and reinforce shielding power of the shield member.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A shield reinforcing apparatus comprising:
   a printed circuit board;
   a shield member that covers the printed circuit board; and
   at least one shield reinforcing part provided in the printed circuit board and configured to contact the shield member to be pressed,
   wherein each of the at least one shield reinforcing part comprises:
      a pair of contact portions that partially contact corresponding contact surfaces of the shield member,
      a support portion provided between the contact portions to contact corresponding support surfaces of the shield member, and
      one or more reinforcing members provided on opposite side surfaces of the contact portions that support the contact portions and reinforce a shielding power of the shield member.

2. The shield reinforcing apparatus of claim 1, wherein the at least one shield reinforcing part comprises a pair of plate springs.

3. The shield reinforcing apparatus of claim 1, wherein the at least one shield reinforcing part is biased towards a lower surface of the shield member.

4. A shield reinforcing apparatus comprising:
   a printed circuit board;
   a shield member that covers the printed circuit board; and
   one or more shield reinforcing parts provided in the printed circuit board,
   wherein the one or more shield reinforcing parts are in partial contact with contact surfaces of the shield member to be pressed and are in contact with support surfaces of the shield member, and
   wherein each of the one or more shield reinforcing parts comprises:
      a pair of contact portions that partially contact corresponding contact surfaces of the shield member, a support portion provided between the contact portions to contact corresponding support surfaces of the shield member, and one or more reinforcing members provided on opposite side surfaces of the contact portions that support the contact portions and reinforce a shielding power of the shield member.

5. The shield reinforcing apparatus of claim 4, wherein the contact surfaces of the shield member are contact recesses that contact the one or more shield reinforcing parts, and wherein the support surfaces of the shield member are support recesses.

6. The shield reinforcing apparatus of claim 4, wherein each of the pair of contact portions is a curved plate spring.

7. The shield reinforcing apparatus of claim 4, wherein each of the pair of contact portions is biased towards the contact surface of the shielding member.

8. The shield reinforcing apparatus of claim 4, wherein the shield reinforcing parts are provided in an electronic device or a portable terminal.

9. The shield reinforcing apparatus of claim 4, wherein the printed circuit board comprises the one or more shield reinforcing parts such that the one or more shield reinforcing parts are in contact with contact surfaces of the shield member on one side, and comprises a plurality of fixing clips such that the fixing clips are in contact with contact surfaces of the shield member on another side.

10. The shield reinforcing apparatus of claim 4, wherein the printed circuit board comprises the one or more shield reinforcing parts such that the one or more shield reinforcing parts are in contact with the entire contact surfaces of the shield member.

11. A shield reinforcing apparatus comprising:
a printed circuit board;
a shield member that covers the printed circuit board; and
one or more shield reinforcing parts provided in the printed circuit board,
wherein the one or more shield reinforcing parts are in full contact with contact surfaces of the shield member to be pressed, and
wherein each of the one or more shield reinforcing parts comprises:
a pair of contact portions that are in full contact with corresponding contact surfaces of the shield member
a support surface provided between the pair of contact portions and one or more reinforcing members provided on opposite side surfaces of the pair of contact portions to support the contact portions and to reinforce a shielding power of the shield member.

12. The shield reinforcing apparatus of claim 11, wherein the contact surfaces of the shield member are contact recesses configured to come in full contact with the one or more shield reinforcing parts.

13. The shield reinforcing apparatus of claim 11, wherein upper portions of each of the pair of contact portions are planar plates, and lower portions of each of the pair of contact portions are curved plates to be connected to the planar plates so as to be pressed.

14. The shield reinforcing apparatus of claim 11, wherein the contact portions are curved plate springs.

15. The shield reinforcing apparatus of claim 11, wherein the contact portions are biased towards the corresponding contact surfaces of the shield member.

16. A shield reinforcing apparatus comprising:
a printed circuit board;
a shield member that covers the printed circuit board; and
one or more shield reinforcing parts provided in the printed circuit board,
wherein the one or more shield reinforcing parts are in full contact with contact surfaces of the shield member to be pressed and in contact with support surfaces of the shield member, and
wherein each of the one or more shield reinforcing parts comprises:
a pair of contact portions configured to come in full contact with corresponding contact surfaces of the shield member,
a support portion provided between the contact portions to contact corresponding support surfaces of the shield member, and
one or more reinforcing members provided on opposite side surfaces of the pair of contact portions to support the contact portions and to reinforce a shielding power of the shield member.

17. The shield reinforcing apparatus of claim 16, wherein the contact surfaces of the shield member are contact bosses to contact the one or more shield reinforcing parts and the support surfaces of the shield member are contact bosses.

* * * * *